US010935282B2

(12) United States Patent
Gorny

(10) Patent No.: US 10,935,282 B2
(45) Date of Patent: Mar. 2, 2021

(54) SINGLE-WALLED CONNECTING KEY FRAMESETS

(71) Applicant: SunPower Corporation, San Jose, CA (US)

(72) Inventor: Lee J. Gorny, Mountain View, CA (US)

(73) Assignee: SunPower Corporation, San Jose (GA)

( * ) Notice: Subject to any disclaimer, the term of this patent is extended or adjusted under 35 U.S.C. 154(b) by 0 days.

(21) Appl. No.: 16/370,565

(22) Filed: Mar. 29, 2019

(65) Prior Publication Data
US 2019/0301771 A1 Oct. 3, 2019

Related U.S. Application Data

(60) Provisional application No. 62/651,035, filed on Mar. 30, 2018.

(51) Int. Cl.
F24S 25/20 (2018.01)
H01L 31/042 (2014.01)
H02S 30/10 (2014.01)
F24S 25/67 (2018.01)

(52) U.S. Cl.
CPC ............... F24S 25/20 (2018.05); F24S 25/67 (2018.05); H01L 31/042 (2013.01); H02S 30/10 (2014.12)

(58) Field of Classification Search
CPC . F24S 25/20; F24S 25/67; F24S 25/65; H01L 31/042; H02S 30/10; Y02E 10/47; Y02E 10/50
See application file for complete search history.

(56) References Cited

U.S. PATENT DOCUMENTS

| 7,487,771 | B1 | 2/2009 | Eiffert et al. | |
|---|---|---|---|---|
| 8,404,966 | B2* | 3/2013 | Nakamura | H02S 30/10 136/251 |
| 8,572,906 | B2* | 11/2013 | Nakamura | H02S 20/00 52/173.3 |
| 8,650,815 | B2* | 2/2014 | Brodam | F24S 40/44 52/177 |
| 8,875,394 | B2 | 11/2014 | Li et al. | |
| 9,057,540 | B2 | 6/2015 | Buettner et al. | |
| 9,157,662 | B2 | 10/2015 | Kim et al. | |
| 9,337,770 | B2* | 5/2016 | Okuda | H02S 30/10 |
| 9,391,222 | B2* | 7/2016 | Gassner | F24S 80/70 |
| 10,024,580 | B2 | 7/2018 | Stephan et al. | |
| 10,063,183 | B2* | 8/2018 | Patton | H02S 30/10 |
| 2005/0115603 | A1* | 6/2005 | Yoshida | H01L 31/048 136/251 |

(Continued)

FOREIGN PATENT DOCUMENTS

| EP | 2234173 | 9/2010 |
|---|---|---|
| JP | 2017099033 A | 6/2017 |
| JP | 2017163701 A | 9/2017 |

OTHER PUBLICATIONS

International Search Report and Written Opinion, PCT Application PCT/US2019/025007, dated Jul. 19, 2019.

Primary Examiner — Rodney Mintz
(74) Attorney, Agent, or Firm — Grasso PLLC

(57) ABSTRACT

Frames and processes of manufacture using single-wall frame sections coupled to other single-wall frame sections or double-wall frame sections using a connecting key are provided. The connecting key can be metallic, polymer, ceramic, a laminate, and combinations thereof.

19 Claims, 10 Drawing Sheets

(56) References Cited

U.S. PATENT DOCUMENTS

| | | | |
|---|---|---|---|
| 2010/0000521 A1* | 1/2010 | Gassner | F24S 25/20 126/680 |
| 2010/0243023 A1 | 9/2010 | Patton et al. | |
| 2010/0243035 A1* | 9/2010 | Nakamura | H02S 30/10 136/251 |
| 2010/0288338 A1* | 11/2010 | Yamamoto | F24S 40/44 136/251 |
| 2011/0120529 A1* | 5/2011 | Nakamura | H02S 20/23 136/251 |
| 2011/0180680 A1* | 7/2011 | Brodam | H02S 30/10 248/346.01 |
| 2011/0194886 A1* | 8/2011 | Wu | E06B 3/9681 403/23 |
| 2011/0259404 A1* | 10/2011 | Jang | H02S 30/10 136/251 |
| 2012/0024350 A1* | 2/2012 | Chan | H02S 30/10 136/251 |
| 2013/0175231 A1 | 7/2013 | Klinga et al. | |
| 2014/0237933 A1* | 8/2014 | Gassner | H01L 31/048 52/653.1 |
| 2014/0352763 A1* | 12/2014 | Chen | F24S 25/65 136/251 |
| 2015/0144179 A1* | 5/2015 | Chen | H02S 30/10 136/251 |
| 2015/0188485 A1* | 7/2015 | Okuda | F24S 40/44 136/259 |
| 2015/0204583 A1 | 7/2015 | Stephan et al. | |
| 2015/0256121 A1 | 9/2015 | Kube | |
| 2016/0285405 A1* | 9/2016 | Stephan | F24S 25/67 |
| 2016/0315580 A1* | 10/2016 | Patton | H01L 31/02 |
| 2016/0365831 A1 | 12/2016 | Gmeiner | |
| 2017/0133982 A1 | 5/2017 | Weinshenker et al. | |
| 2017/0163210 A1* | 6/2017 | Gorny | H02S 30/10 |
| 2019/0305715 A1* | 10/2019 | Gorny | B65D 57/00 |
| 2019/0312545 A1* | 10/2019 | Gorny | H02S 30/10 |
| 2020/0321908 A1* | 10/2020 | Anders | H02S 40/36 |

* cited by examiner

SINGLE-WALLED CONNECTING KEY FRAMESETS

RELATED APPLICATION

This application claims priority to provisional application 62/651,035, which was filed on Mar. 30, 2018 and is entitled Single-Walled Connecting Key Framesets. The '035 application is incorporated herein in its entirety by reference.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

DETAILED DESCRIPTION

Figure 1B:
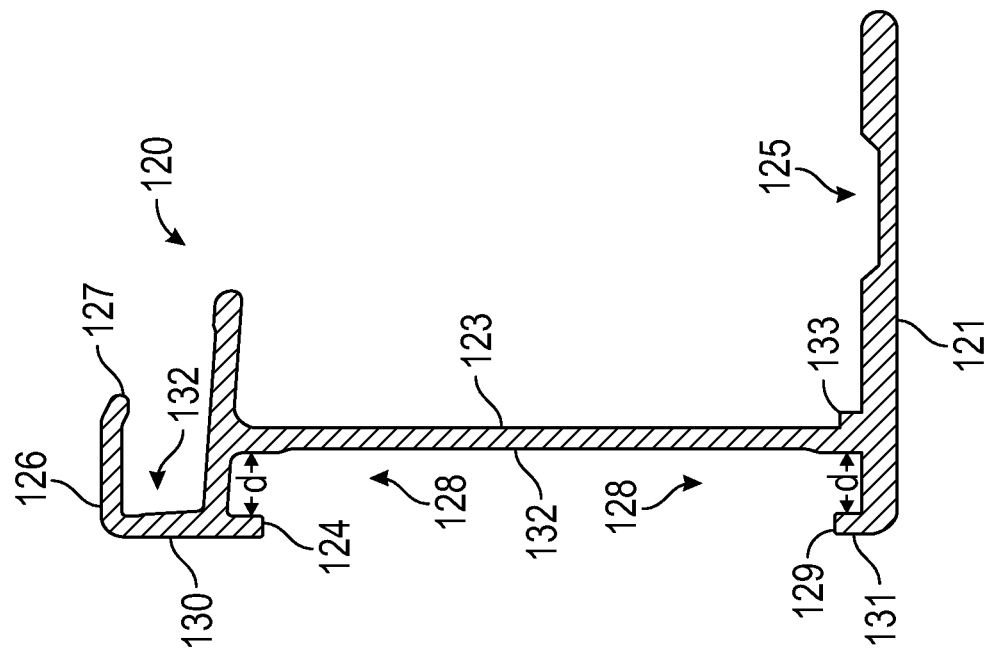
FIGS. 1A-1B illustrate cross-sectional views of double-wall and single-wall frame sections as can be employed, according to some embodiments.

The following detailed description is merely illustrative in nature and is not intended to limit the embodiments the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"A", "an", "the". As used herein, the singular forms "a," "an" and "the" are intended to include plural forms as well, unless the context clearly indicates otherwise.

"About" or "Approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

"Comprising" is an open-ended term that does not foreclose additional structure or steps.

"Configured to" connotes structure by indicating a device, such as a unit or component, includes structure that performs a task or tasks during operation, and such structure is configured to perform the task even when the device is not currently operational (e.g., is not on/active). A device "configured to" perform one or more tasks is expressly intended to not invoke 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" frame connecting key does not necessarily imply that this frame connecting key is the first frame connecting key in a sequence; instead the term "first" is used to differentiate this connecting key from another connecting key (e.g., a "second" connecting key).

"Based On." As used herein, this term is used to describe one or more factors that affect a determination. This term does not foreclose additional factors that can affect a determination. That is, a determination can be solely based on those factors or based, at least in part, on those factors. Consider the phrase "determine A based on B." While B can be a factor that affects the determination of A, such a phrase does not foreclose the determination of A from also being based on C. In other instances, A can be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit" describes a reducing, lessening, minimizing, or effectively or actually eliminating something, such as completely preventing a result, outcome or future state completely.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure can be practiced without these specific details. In other instances, well-known techniques are not described in detail in order to not unnecessarily obscure embodiments of the present disclosure.

PV modules can include glass laminates comprising an array of PV cells along with a microinverter receiving a DC voltage from the PV cells and cabling supplying the output from the microinverter to a load or other external recipient. The glass laminates of the PV modules can be surrounded by a metal frame, which can be referred to herein as a PV frame or a frame, and the microinverter and the cabling can be secured to this metal frame. The metal frame can, in-turn, be used to secure the PV module with microinverter and cabling to a support structure.

Embodiments can include sectional PV frames and processes of manufacture whereby single-wall frame sections are coupled to other single-wall frame sections or to double-wall frame sections using one or more connecting keys. The connecting keys can be metallic, polymer, ceramic, laminate, and combinations thereof. In other words, the connecting keys can include one or more materials and these materials can be integrated with each other to form an homogenous material or can be layered as a composite material, e.g., a metallic shell with a polymer insert, a metallic shell with a ceramic insert, or a ceramic layer coupled to a polymer layer, which is itself coupled to a metallic layer, etc. The connecting keys can be fashioned such that they can be secured to one or two or more PV frame sections using the same connection methodologies or using different connection methodologies. In other words, for example, when connecting two frame sections together, a connecting key can be secured to a single-wall frame segment using screws, rivets, welding, a constraining protrusion, frictional tight-fit engagements, or other mechanical or chemical fastening systems, or combinations thereof, and can be secured to a double-walled frame section using these same or other connection techniques as well. A frictional tight-fit connection can be made during a subsequent assembly stage or in the field prior to installation, as well as during an earlier assembly stage or process.

Figure 11:
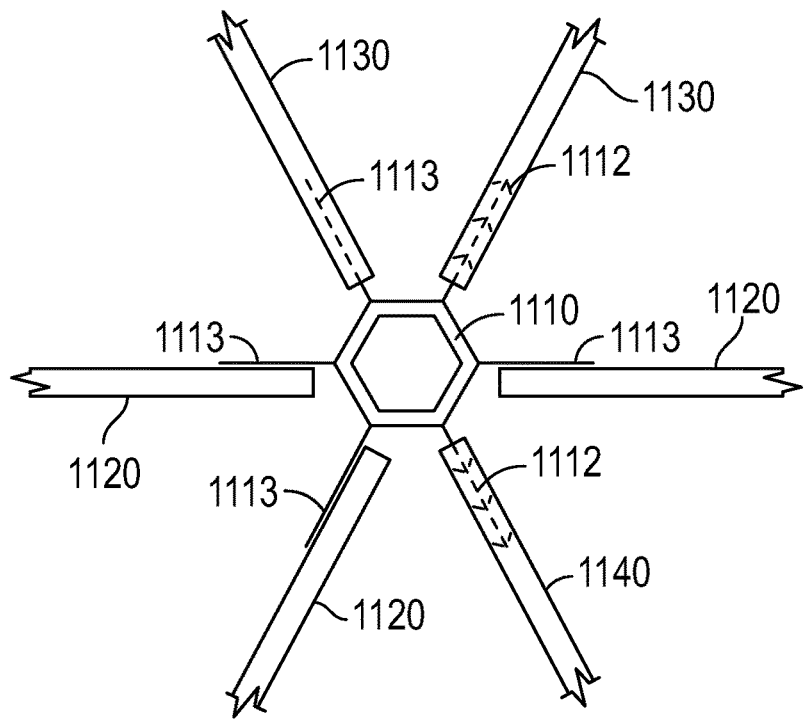
FIG. 11 illustrates a plan view of a connecting key serving as a central hub for six frame sections as can be employed, according to some embodiments.

Assembled framesets, i.e., when more than one single-walled or double-walled frame sections are coupled together, can include various shapes including single polygons such as squares, pentagons, and triangles as well as multiple single polygons grouped together. In some embodiments the frame sections can be curved and assembled framesets can include curved and straight frame sections as well as all curved frame sections, or all straight frame sections, with one or more of the curved or straight frame sections being joined by connecting keys. Moreover, connecting keys in embodiments can also serve as central hubs and in-line connectors in addition to serving as corner connectors. For example, when connecting three or more frame sections, as can be employed in a central hub of a multiple polygon framing system, a connecting key can be configured to connect three single-wall frame sections, a double-wall frame section, and three triple wall frame sections, or other combinations of frame sections. For example, as is shown in FIG. 11, a connecting key 1110 can have a central section and six outwardly extending arms 1112, 1113, where each arm 1112, 1113, is configured as described herein to secure to either single-wall 1120, double-wall 1130, or triple-wall 1140, framing segments. Embodiments can employ connecting keys with fewer or more arms than those shown in FIG. 11.

Figure 5:
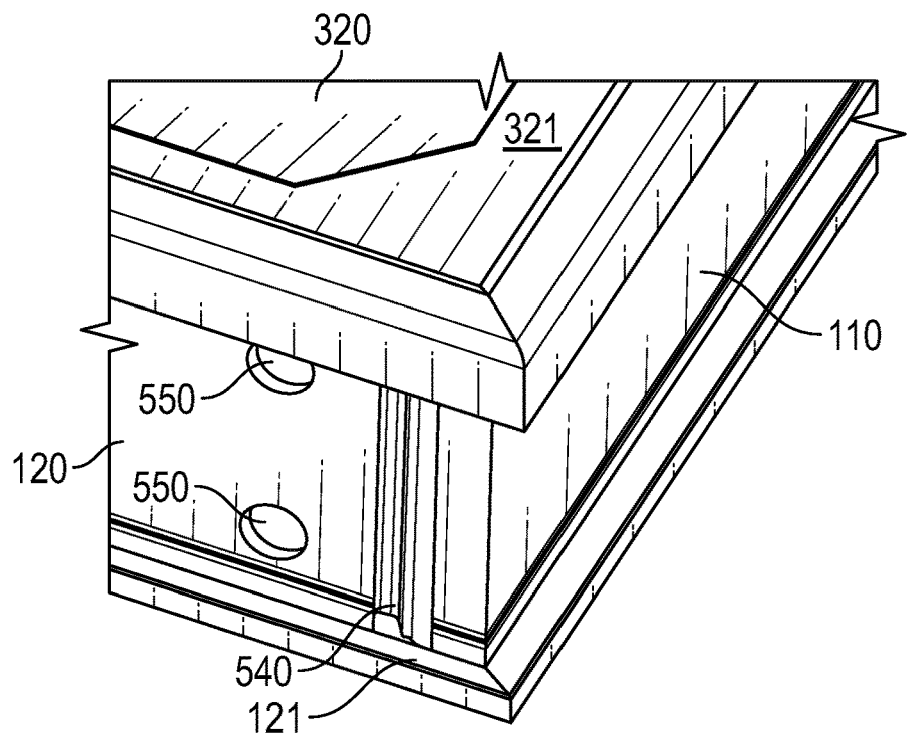
FIG. 5 illustrates a perspective corner view of a single-wall frame section to be joined to a double-wall frame section using a connecting key with alignment tabs and a constraining protrusion as can be employed, according to some embodiments.
Figure 6:
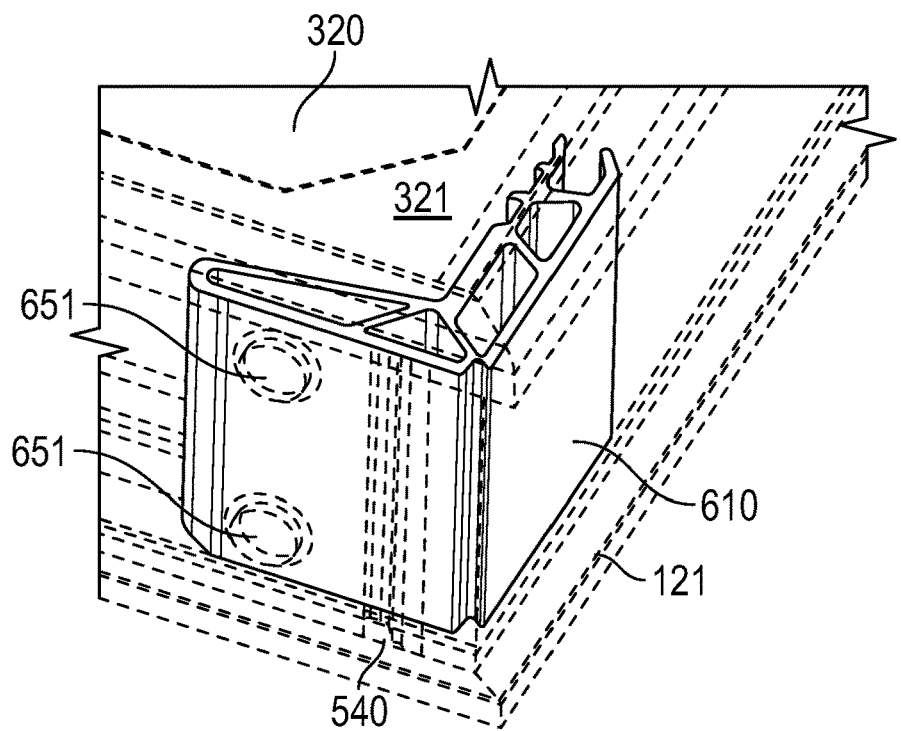
FIG. 6 illustrates the same perspective corner view as FIG. 5 and also includes ghost lines to illustrate details of the connecting key and its securement of the two frame sections as can be employed, according to some embodiments.
Figure 13A:
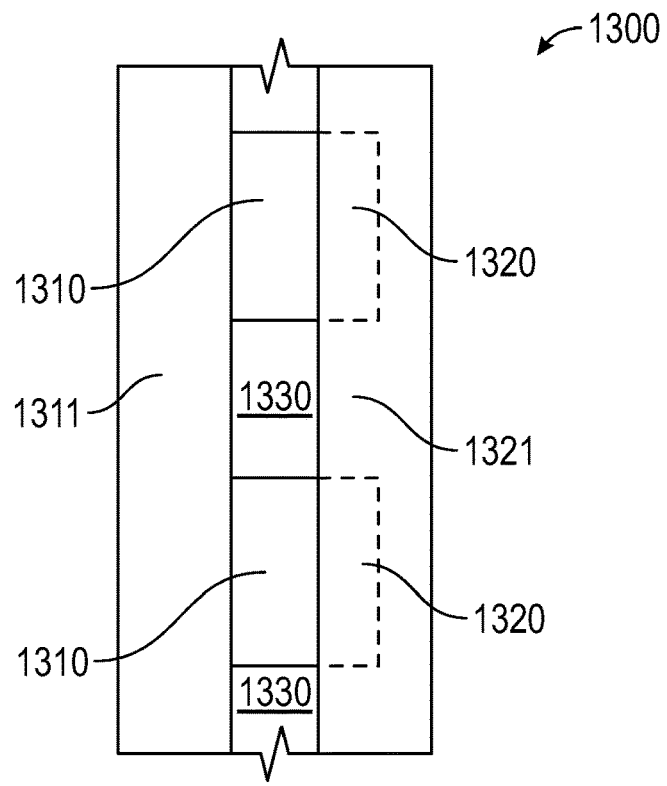
FIGS. 13A and 13B illustrate the seating or connection of a tab and recess as can be employed, according to some embodiments.
Figure 13B:
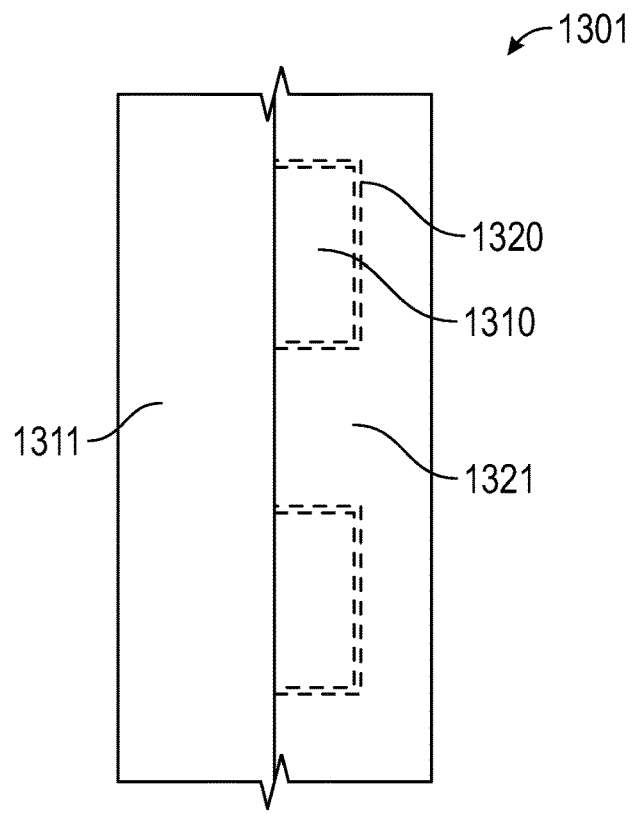

The connecting keys and the frames can include alignment tabs such as 651 of FIG. 6 and corresponding alignment recesses or voids in the frames such as 550 in FIG. 5, to assist in assembly and alignment. In these and in other embodiments, assembly can be assisted by the alignment tab moving during a securement step, e.g., through deflection, and then having the tab return to an original or near original position when a connecting key arm or other portion and a frame section or other component are joined. FIGS. 13A-13B illustrate tabs before and after mating with a corresponding alignment recess. Additional securement, such as fasteners (e.g., screws, rivets, pins) as well as welding, adhesives, and other features mentioned herein, or combinations thereof, can also be employed to secure or permanently secure a connecting key to a particular frame segment.

Figure 12:
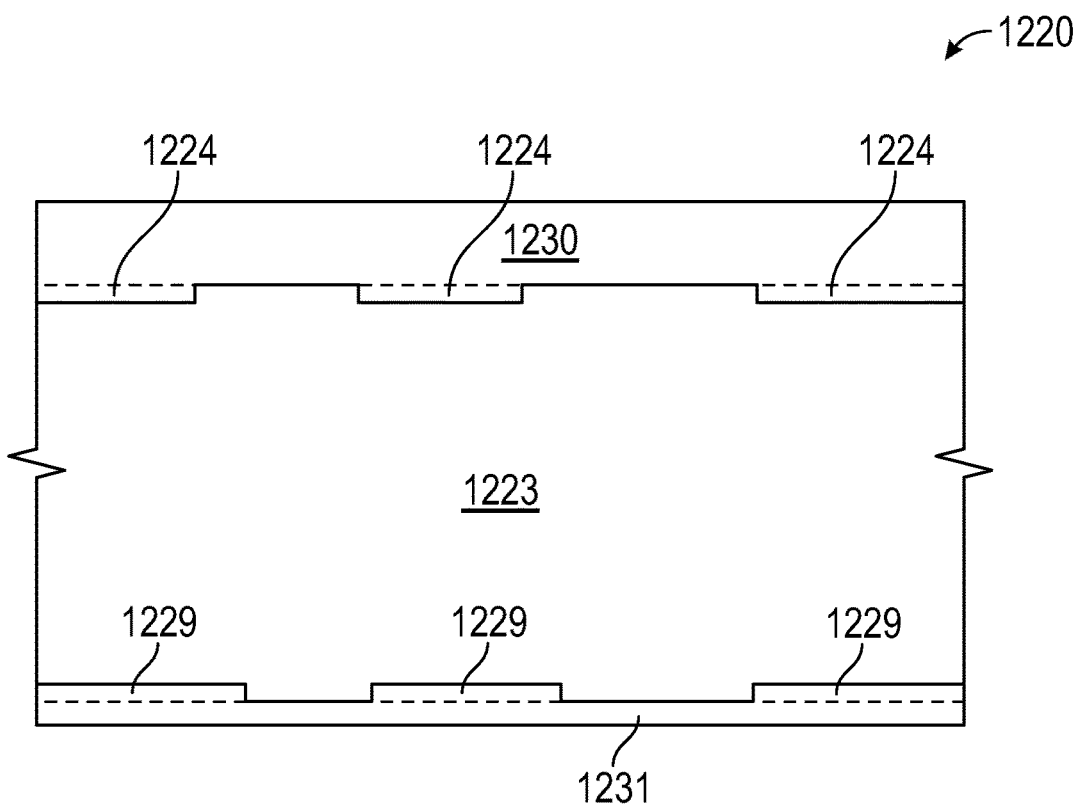
FIG. 12 illustrates a side elevation view of a frame section as can be employed, according to some embodiments.

In embodiments, frame sections can be designated herein as short side and long side segments to denote a relative comparison between frame segments of the same or different frames. Also, embodiments can employ connection features that do not occupy the entire length of a frame section. In other words, when frame sections are extruded, embodiments can employ connecting features at the ends of each frame section that are not maintained along the entire length of the frame section but are, instead, solely located at or near the ends of the frame section. These connecting features can include alignment tabs and alignment recesses in one or both of the frames and the connecting keys. For example, referring to FIGS. 1A-1B, the flange cap end 114 and 124 and the turned flange end 129, 133 may not exist along an entire length of a frame section 120, 110, but, can, instead only be located at the ends of a frame section and/or interim middle portions, to allow the section to be coupled to and by a connecting key. FIG. 12 shows an example of how a flange cap end 1224 and a turned flange 1229 can occupy only a portion of the length of a frame section 1220. Also labelled in FIG. 12 are the web 1223, the end cap web 1230 and the turned flange 1231. Similarly, the flange cap 116 and 126 of FIGS. 1A-1B may not be present along an entire length of a frame section, and can, instead, be located at set distances along the length of the frame section, for an example, every two inches, an inch of flange cap can exist; other space lengths and flange cap lengths can be used.

In embodiments, connecting keys can be secured to one or more frame sections using aluminum bonding techniques that work for anodized surfaces as well as, or in addition to, formed fittings (e.g., Tox fittings), advanced welds (e.g., stir) and advanced adhesives or the other securement systems identified herein, e.g., adhesive bars. Other securement methods and means can also be used, as well as combinations of securements.

In embodiments, during assembly, a connecting key can be secured to a single-wall segment using one or more of the securement methods described herein as well as other techniques and configurations. Later, this single walled frame section can be joined with a double-walled section by pressing an arm of the connecting key into the frame section being joined. If the section to be joined is a single wall section, then friction securement systems, in addition to press fitting or instead of press fitting, can be employed. For example, the connecting key can be slid into the channel 128 of FIG. 1B and secured against the web 123 and the flange cap end 124 and the turned flange end 129 as a press fit connection. A connecting key can also be secured to a web 123 or other portion of a single wall frame section with adhesives, screws, or other connection techniques, such as those as mentioned herein.

Figure 10A:
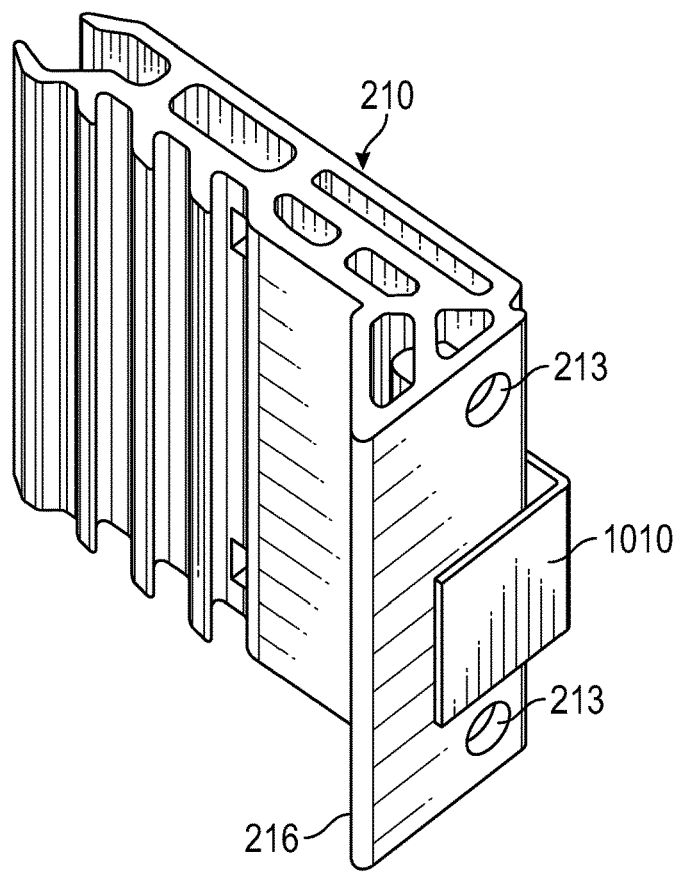
FIGS. 10A-10C illustrate a connecting key with various clip configurations as can be employed, according to some embodiments.
Figure 10B:
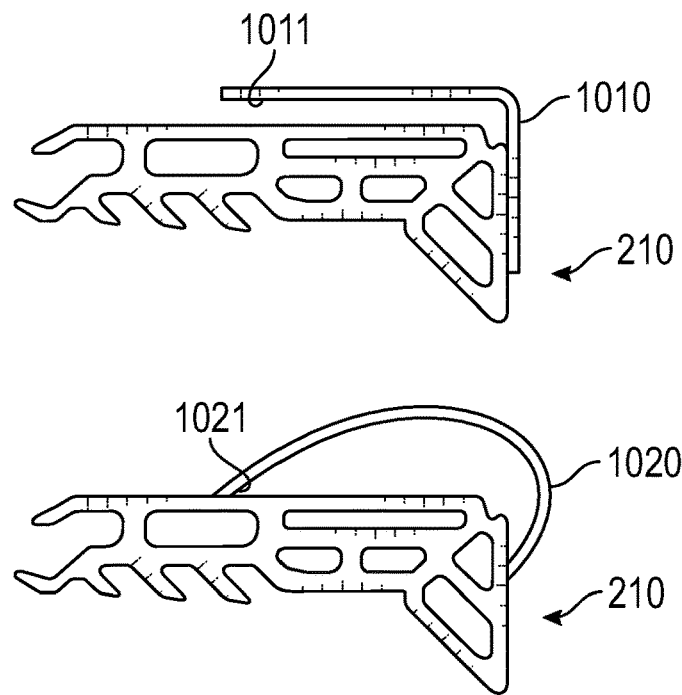
Figure 10C:
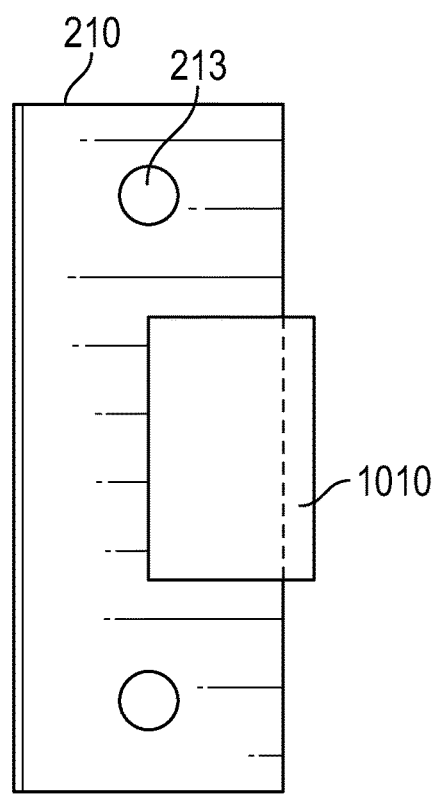

Embodiments can preferably provide electrical continuity between frame sections being connected. Continuity features can include conducting strips in connection keys as well as locking features of two wall sections to be joined so that electrical conductivity between frame segments is preferably maintained after the frameset is assembled. The connecting keys can include clips, as shown in FIGS. 10A-10C, which can serve to scratch the surface of an adjoining frame section when the connecting key is mated with the frame section. This surface scratching can provide electrical continuity through the connecting key and between joined frame sections. Thus, a connecting key can be joined to anodized aluminum framesets in many ways. These can include, but are not limited to, friction fit, clips, screwing, riveting, welding, bending, clinching (Tox), or the use of adhesives, or a combination of these. Many of these methods can likewise provide electrical ground continuity via the connecting key as well, including if a conductive adhesive was used on coating abrasions on portions of the frame. For example, in embodiments, a frame section can be pressed into an adjacent double walled frame section that can be installed on a long side of a PV laminate providing continuity and mechanical bonding between the joined frame sides. This can result with embodiments in framesets (e.g., single wall/double wall) that have reduced material costs from purely double wall frame sets and can have sufficient continuity between joined frame sections.

As another example, in embodiments, a single-wall short side frameset can be coupled to a connecting key using one of these methods in a kitting process performed by a manufacturer. In an example, a kitting process can include gathering the components needed for an assembly and placing them together in a single kit for use at the job site during installation. These kits can include some assembled components while other components are not connected and left for assembly in the field or at a later stage.

Figure 1A:
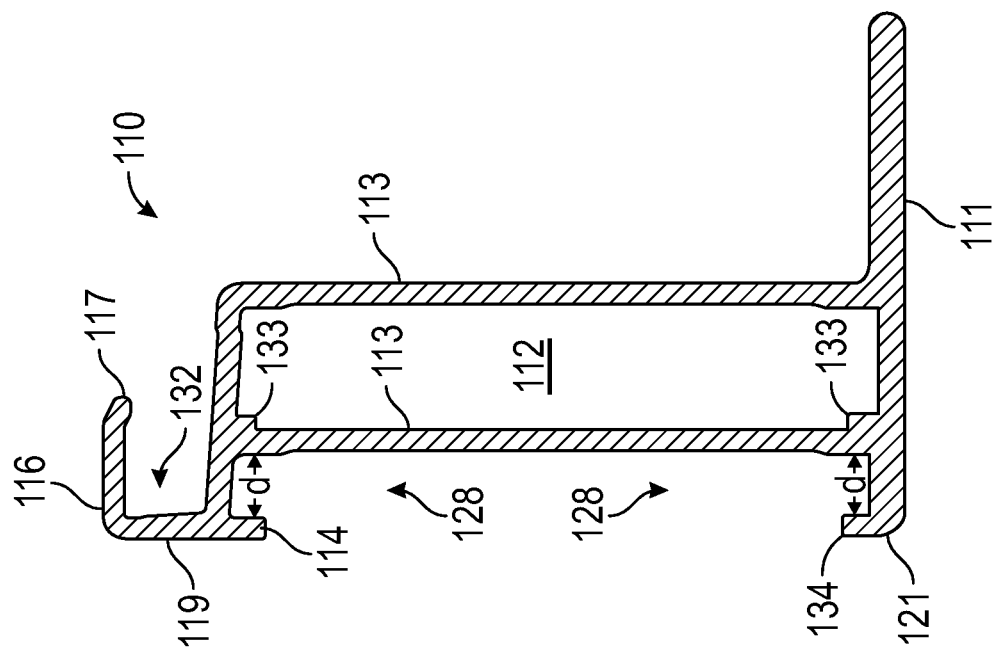

Turning now to FIGS. 1A-1B, which illustrate cross-sectional views of single-wall 120 (FIG. 1B) and double-wall 110 (FIG. 1A) frame sections as can be employed in some embodiments. As can be seen, each frame section includes a flange 111, 121, 121, 131 and an exposed flange channel 132 for receiving a PV laminate edge. A frame hollow 112, between both webs 113 of the double-wall frame section 110, is also shown. In embodiments, these frame sections can have various lengths, including approximately in the range of 0.25 meters-2 meters or more and intervening sizes in increments of 0.1 meters or less. Also labelled in FIG. 1 are flange end cap 116, flange end cap 126, rounded flange cap end 117, rounded flange cap end 127, straight flange cap end 114, straight flange cap end 124, end cap web 130, 119, web reinforcement 133, web 113, web 123, frame hollow 112, turned flange end 129, 134, and flange recess 125. Flange cap ends 117, 127, 114, and 124 can be rounded (as illustrated in flange cap ends 117 and 127) or straight (as illustrated in flange cap ends 114, 124) or have other configurations as well. Likewise, other ends of frame sections 110, 120, regardless of whether designated by numerals herein, can be rounded or straight.

In embodiments, and as noted above, connecting keys can have arms that engage through friction and/or connectors, such as screws or tox fittings, or rivets, or other connector schemes, or combinations thereof, to portions of a frame section, e.g., 110 and 120 of FIGS. 1A-1B. In embodiments, a key, such as key 210 of FIG. 2, can engage the web 113, 123, or slide into an exposed flange channel 128, or engage both, when connecting frame sections. As noted above, the key can provide an electrical continuity for grounding or other purposes between connected frame sections. The continuity can be provided by connectors of the key and by other structures as well.

In embodiments, the channel of a frame section, e.g., 132 of FIGS. 1A-1B, can be sized to accept an edge or other portion of a photovoltaic (PV) laminate in order to support or reinforce the PV laminate. As can be seen in FIGS. 1A-1B, the flange cap end 114, 124 and the turned flange end 134, 129 can be positioned opposing each other and about the same distance: d from a web 113, 123 in order to create an exposed channel 128 for accepting a connecting key. Moreover, the distance d can be used when adding a connecting key or splitting a connecting key around a central web or other wall. In certain embodiments, for fitment purposes the central wall or web 123/132 can be punched away, otherwise removed, or shifted such that a key portion can be positioned somewhere between the two 113 walls on the double walled section.

Figure 2:
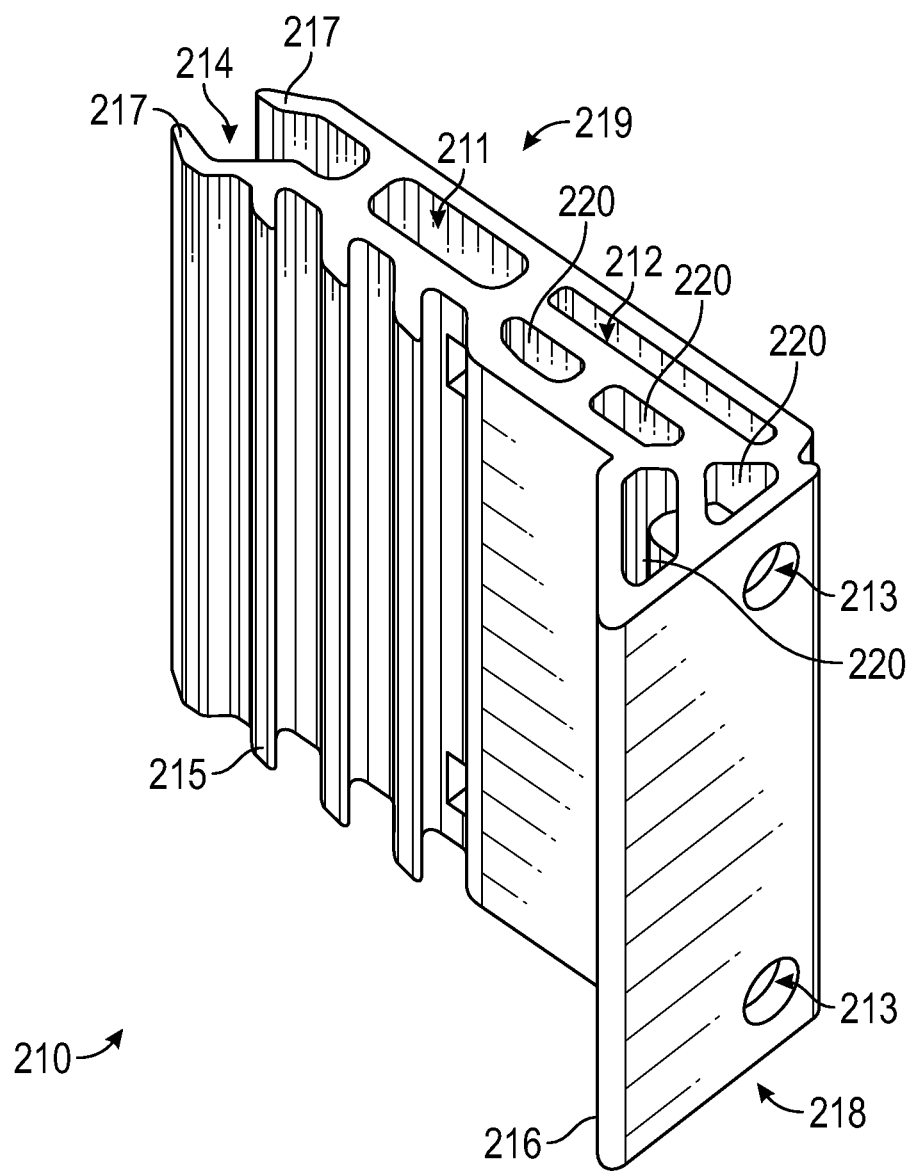
FIG. 2 illustrates a perspective view of a single-wall/double-wall key as can be employed, according to some embodiments.

FIG. 2 illustrates a perspective view of a single-wall/double-wall connecting key 210 as can be employed, according to some embodiments. In an embodiment, this connecting key 210 is a single-wall key with two connecting holes 213. In an embodiment, the single-wall key can be a single-wall aluminum key. Other materials, such as galvanized steel, or carbon laminate, or polymers, can also be used. Additionally, one connecting hole, or more than two connecting holes, such as 3, 4, 5, or more connecting holes, can be employed in embodiments. These connecting holes 213 can be used to secure the key to a single wall frame section during manufacture. In an example, the connecting holes can instead be referred to as screw holes, and screws can be used as connectors; however, the connecting holes can have other configurations, such as a rod-hole combination, a pin-hole combination, a rivet-hole combination, a tox-hole combination, and a tab- or flange-slot/recess combination, and combinations thereof. Once connected the end of the key with the teeth or friction fins 215 can be slid into the frame hollow 112 of the double wall section shown in FIG. 1A or can be slid into the exposed flange channel 128 of either of the double wall section of FIG. 1A or the single wall section of FIG. 1B. The teeth 215 of the key 210 can engage the web 113, 123 of a frame as well as other portions of the frame sections and thereby serve to frictionally connect a single wall frame section to a double-wall frame section, or to connect two double-wall frame sections or two single-wall frame sections.

Also labelled in FIG. 2 are an open-end hollow 214, pinching ends 217, long key arm 219, optional key hollows 211, 212, 220, short key arm 218, and edge key arm 216. In some embodiments, a key arm can be sized to fit and engage an exposed flange channel 128 of either a single wall frame section 120 or a double wall frame section 110. In some embodiments, the connecting key can have two short key arms, two long keys arms, three or more key arms (such as when connecting three or more frame sections together), a long key arm and a short key arm, and various permutations of these examples. As noted above, the connecting holes 213 can be threaded to accept screws and can also be sized or configured for other connectors, e.g., pins, rods, rivets, tox connectors, etc. Other connection techniques can be used, such as a flange-slot/recess combination or a tab-slot/recess combination.

In embodiments, connecting keys can join frame sections at various angles that can include: 11.25°, 22.5°, 45°, 60°, 75°, 90°, 110°, 115°, 125°, 135°, and 180°. The frame sections can be made from various materials and can include a metal of sufficient rigidity. In embodiments, the connecting keys and frame sections can be galvanized, anodized, or otherwise treated to resist weathering.

Figure 3:
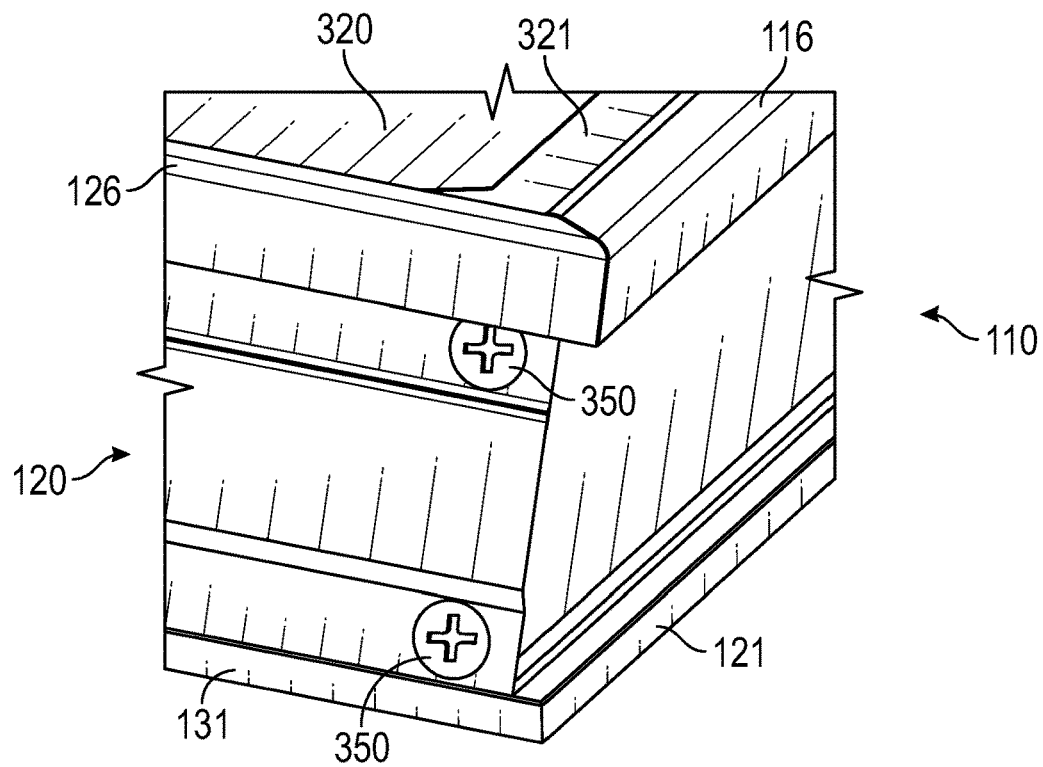
FIG. 3 illustrates a perspective corner view of a single-wall frame section joined to a double-wall frame section using a connecting key with screw fasteners as can be employed, according to some embodiments.

FIG. 3 illustrates a perspective corner view of a single-wall frame section 120 joined to a double-wall frame section 110 using a connecting key with screws 350 along a short arm as can be employed, according to some embodiments. The top and bottom flange sections e.g., 116, 126, 121, 131, of the frame wall sections, 110, 120 are visible along with the connectors, e.g., screws 350, securing the connecting key to the single wall frame section 120. The PV laminate 320 with upward facing PV cells and PV laminate edge 321 are visible in FIG. 3 and FIG. 4.

Figure 4:
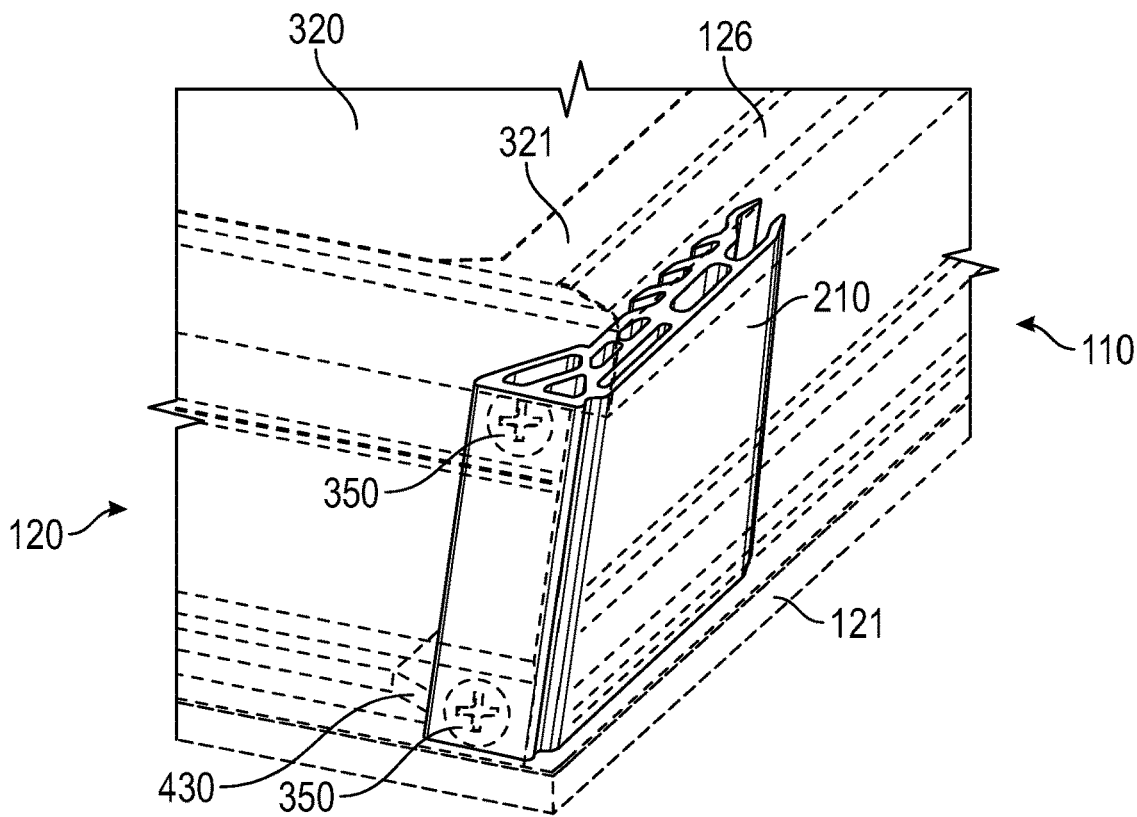
FIG. 4 illustrates the same perspective corner view as FIG. 3 and also includes ghost lines to illustrate details of the connecting key and its securement of the two frame sections as can be employed, according to some embodiments.

FIG. 4 illustrates the same perspective corner view as FIG. 3, but uses ghost lines to illustrate details of the connecting key 210 and its securement of the two frame sections as can be employed, according to some embodiments. Shadow or ghost lines reveal the location of the connecting key 210 relative to the single wall frame section 120 and the double wall frame section 110 in FIG. 4. The two screws 350 and the angled meeting 430 of the bottom flanges of the wall sections are also visible in FIG. 4. The single wall frame 120, and double wall frame 110 are each labelled in FIGS. 3 and 4. Also labelled in FIG. 4 are the PV laminate edge 321, the PV laminate 320, and the flange end cap 126.

FIG. 5 illustrates a perspective corner view of a single-wall frame section 120 joined to a double-wall frame section 110 using a connecting key 610 with alignment tabs and a constraining protrusion 540 as can be employed, according to some embodiments. Labelled in FIG. 5 are a PV laminate 320, PV laminate edge 321, single wall frame section 120, adhesive bar 540, and alignment recesses 550.

In some embodiments, rather than or in addition to fasteners, constraining protrusions 540 can be used to secure one or more frame walls to a connecting key. These protrusions 540 can form abutments upon which connecting keys or features of the adjoining frame section can press against. The constraining protrusion can include a pressure fit tongue that snaps into place to receive and then hold a portion of a connecting key or feature of an adjoining frame section. Alignment tabs 651 of FIG. 6 and recesses 550 of FIG. 5 can also be employed on frame walls, as well as the connecting keys to assist in alignment and securing the walls and keys together. During an assembly process, for example, where a tab on a wall section meets a recess on a connecting key, the parts can deflect and then return to an original position as they become biased to remain in that relative orientation and further connecting processes can be carried out. These further processes can include using fasteners to connect the two pieces together as well as using a constraining protrusion, brazing, or another connection methodology. Deformable Tox connectors or other connecting schemes can be used when aligning and securing key connectors to frame sections. FIG. 13A (during assembly view 1300) and 13B (after assembly view 1301) show the seating or connection of a tab and recess as can be employed in embodiments. FIG. 13A shows a key section 1311 with two tabs 1310 being slid to connect with the recesses 1320 of a frame section 1321. As can be seen, a space 1330 exists between the frame section 1321 and the connector 1311 while the pieces are being slid together. Once connected, as shown in FIG. 13B, the tabs 1310 are positioned within the recesses 1320 and no space or little space exists between the frame section 1321 and the key section 1311.

FIG. 6 illustrates the same perspective corner view as FIG. 5 and also includes ghost lines to illustrate details of the key and its securement of the two frame sections as can be employed, according to some embodiments. The alignment tabs 651 are labelled along with the double wall frame section bottom flange 121, the constraining protrusion 540, PV laminate edge 321, and PV laminate 320.

Figure 7:
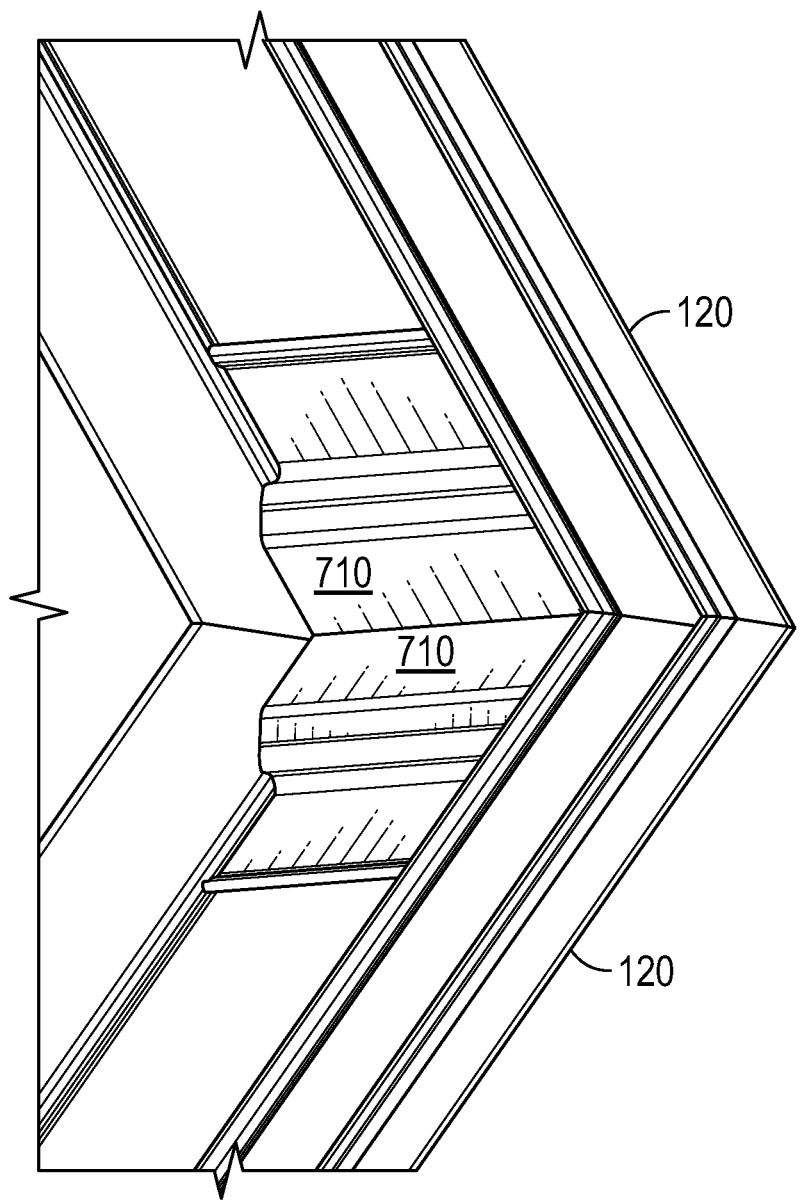
FIG. 7 shows a perspective cut-away view of a single-wall frame section joined to a single-wall frame section using a connecting key as can be employed, according to some embodiments.

FIG. 7 shows a perspective view of a single-wall frame section 120 joined to a single-wall frame section 120 using a connecting key 710 as can be employed, according to some embodiments. As can be seen in FIG. 7, the 1w/1w connecting key 710 has arms of equal length and the connecting key 710 is configured to fit within an exposed channel bordered by top and bottom flanges of single-wall frame sections 120. This connecting key is in the form of a right angle but other angles can also be formed by connecting keys as described herein.

Figure 8:
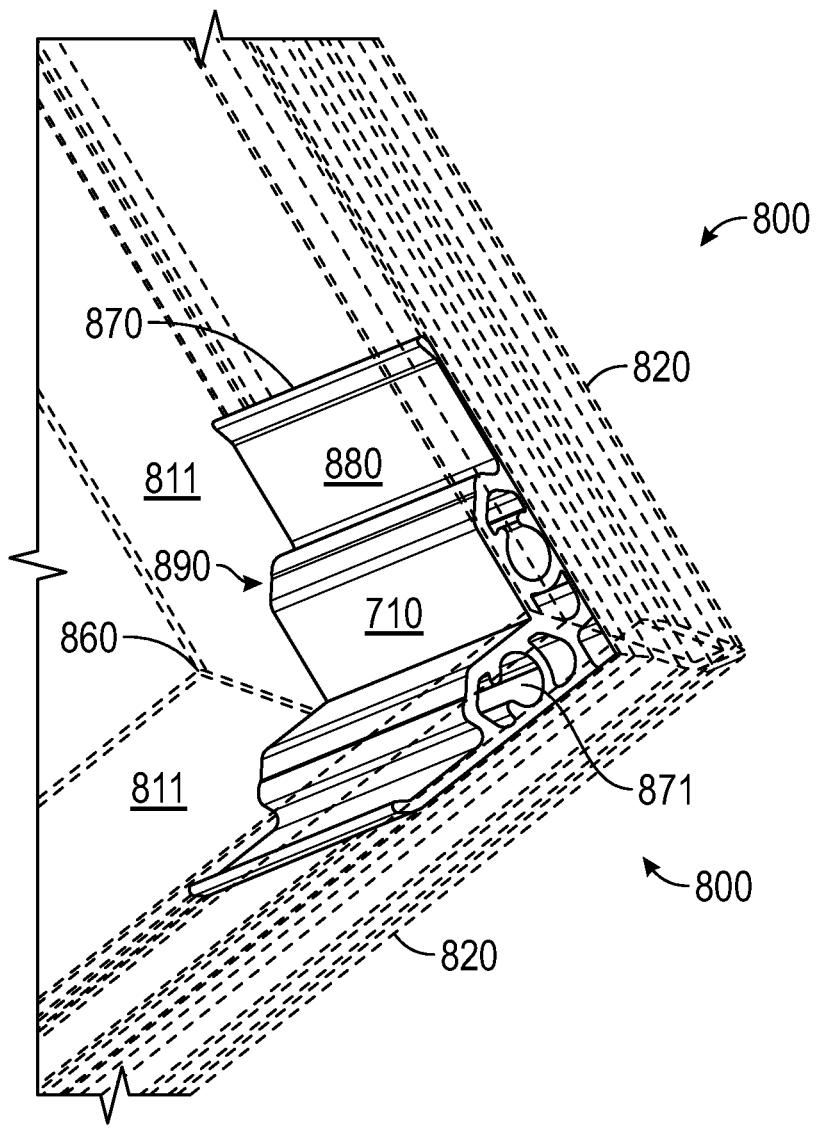
FIG. 8 illustrates the same perspective corner view as FIG. 7 and also includes ghost lines to illustrate details of the connecting key and its securement of the two single-wall frame sections as can be employed, according to some embodiments.

As can be seen in FIG. 8, each arm of the connecting key has a relatively thicker section 890 and a relatively thinner section 880. The thicker section 890 can be employed for securement to the single-wall section while the thinner section 880 can provide alignment between the connecting key 710 and the single-wall frame section or double wall frame section as well as stiffness reinforcement to a single-wall frame section. The thinner section 880 may include an upturned end 870 to assist in inserting the arm into a frame section. When connecting a connecting key to an exposed flange channel, such as 128 of FIG. 1B, the thinner section 880 can serve to initially align the key and frame set together during assembly and the thicker section 890 can serve to fit tightly between the flange cap end and turned flange end, e.g., 124, 129 of FIG. 1B, and the web of the frame section, e.g., 123 of FIG. 1B, and secure the key connector to the frame section after assembly and during use.

FIG. 8 illustrates the same perspective corner view as FIG. 7 and also includes ghost lines to illustrate details of the connecting key and its securement of the two single-wall frame sections 800, as can be employed in embodiments. Visible in this perspective view are the bottom flanges 820 and top flanges 811 of the frame sections, as well as hollows 871 of key 710. As can be seen, the bottom flange is wider than the top flange of the frame wall sections. Also visible is that the frame sections meet at 45° mitered angles 860. These mitered joints can be other angles as well in embodiments, and can be further reinforced, for example, with glue, soldering, and crimping or other fastening methods. In addition, the joints can have gaps between them or can meet fully. The gaps can provide for flexion or adjustment during final assembly stages. Flexion here can be understood to mean the action of bending or the condition of being bent, for example, the bending of a joint or connection. The gaps can also allow for clips to protrude from the connecting keys and engage a web face or other portion of a frame section. Exemplary clips are illustrated in FIGS. 10A-10C.

Figure 9:
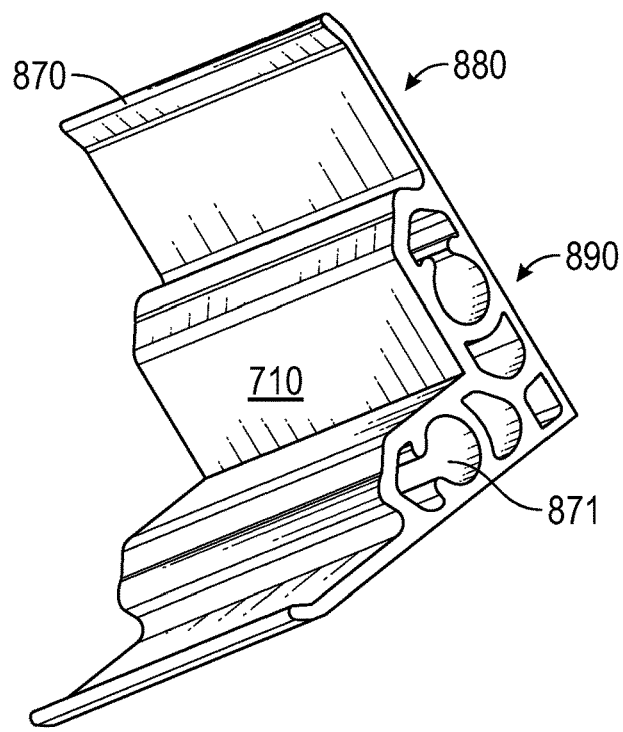
FIG. 9 illustrates details of the connecting key from FIG. 7 and FIG. 8.

FIG. 9 illustrates details of the connecting key 710 from FIG. 7 and from FIG. 8. Visible here are the thinner section 880 and the thicker section 890 of the connecting key. The thinner section 880 can be sized and configured to assist in positioning and inserting the key 710 into a frame section while the thicker section 890 can be sized and configured to provide rigidity and strength for securing the connected frame sections together. In embodiments, the thinner section can be on the order of approximately 2 mm-10 mm or more while the thicker section can be on the order of approximately 5 mm-30 mm or more. These thicknesses can be more or less and can be determined by the materials being employed for the connecting key and/or the frame sections. Multiple hollows 871 are also illustrated in the connecting key 710 of FIG. 9.

FIGS. 10A-10C show a connecting key 210 with various clip configurations as can be employed, according to some embodiments. Labelled in FIGS. 10A-10C are connecting key 210, clip 1010, arched pinching clip 1020, and connecting holes 213. The clips 1010 and 1020 can be employed to create or reinforce electrical continuity between joined frame sections. These clips 1010 and 1020 of FIGS. 10A-10C can be formed of the same materials as the key connectors identified above as well as different materials. The frame sections can be scratched or etched by the clips during assembly so as to provide metal to metal conduction. The surface 1011 and 1021 of FIG. 10B can scratch or etch the frames as the key connectors are connected to the frame sections. The frames can also be contoured or spaced so as to cover the clips or portions of the clips when the frames are connected with a key connector.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A photovoltaic laminate frame system comprising:
a single-wall frame section;
a double-wall frame section; and
a connecting key, the connecting key configured to couple the single-wall frame section with the double-wall frame section, the connecting key having a first arm and a second arm, the first arm having a length and the second arm having a length,
wherein the first arm of the connecting key is secured to the single: wall frame section with one or more fasteners, the fasteners not being parallel to the single-wall frame section,
wherein the second arm of the connecting key is secured to the double-wall frame section, and
wherein the length of the first arm is shorter than the length of the second arm.

2. The frame system of claim 1 further comprising:
a photovoltaic laminate positioned in a channel of the single-wall frame section and positioned in a channel of the double-wall frame section.

3. The frame system of claim 1 wherein the one or more fasteners comprises an adhesive and wherein the connecting key is secured to the double-wall frame section with a frictional engagement between walls of the double-wall frame section.

4. The frame system of claim 1 wherein the one of more fasteners is perpendicular to a wall of the single-wall frame section and parallel to a wall of the double-wall frame section.

5. The frame system of claim 1 wherein the coupled connecting key, single-wall frame section and double-wall frame section are electrically conductive.

6. The frame system of claim 1 wherein the connecting key is configured with a tab or recess positioned to meet an opposing tab or recess on the single-wall frame section.

7. The frame system of claim 1 wherein the single-wall frame section and the double-wall frame-section each have a bottom flange, this bottom flange of each frames section has an angled corner.

8. The frame system of claim 1 wherein the connecting key comprises anodized aluminum.

9. The frame system of claim 1 further comprising:
a second double-wall frame section, the second double-wall frame section coupled to the connecting key.

10. A photovoltaic laminate frameset comprising:
a single-wall frame section having an outermost surface;
a double-wall frame section having an outermost surface; and
a connecting key, the connecting key having a first key arm and a second key arm, the first key arm having a length and the second key arm having a length,
wherein in a coupled configuration:
the connecting key is coupled to the single-wall frame section and the double-wall frame section such that (a) no portion of the connecting key extends beyond the outermost surface of the single-wall frame section, and (b) no portion of the connecting key extends beyond the outermost surface of the double-wall frame section.

11. The frameset of claim 10 wherein the second key arm is coupled to the single-wall frame section with a butt joint.

12. The frameset of claim 10 wherein the length of the first key arm is greater than the length of the second key arm.

13. The frameset of claim 10 wherein the second key arm has an outer perimeter cross-section in the shape of a triangle.

14. The frameset of claim 10 wherein the first key arm has a distal end and the second key arm has a distal end, the shape of the distal end of the first key arm is different than the shape of the distal end of the second key arm.

15. The frameset of claim 10 wherein the first key arm comprises a plurality of friction fins, pinching ends, and an open hollow at a distal end thereof.

16. A photovoltaic laminate frameset comprising:
   a single-wall metallic frame comprising a wall surface;
   a double-wall metallic frame section having a first wall and a second wall; and
   a electrically conducting connecting key, the connecting key having a first key arm and a second key arm, the first key arm having a length and the second key arm having a length,
   wherein the first key arm is coupled to the double-wall metallic frame section with a friction fit configuration, the friction fit configuration applying friction between the first key arm and the first wall and the second wall of the double-wall metallic frame section, and
   wherein the second key arm is coupled to the single-wall metallic frame section without the same friction fit configuration of the first key arm.

17. The frameset of claim 16 wherein the length of the first key arm is greater than twice the length of the second key arm.

18. The frameset of claim 16 wherein the friction fit configuration of the first key arm includes friction fins on a first side of the first key arm and a planar surface on a second side of the first key arm.

19. The frameset of claim 18 wherein the first side and the second side are opposite each other.

* * * * *